(12) United States Patent
Chae et al.

(10) Patent No.: US 9,905,460 B2
(45) Date of Patent: Feb. 27, 2018

(54) METHODS OF SELF-FORMING BARRIER FORMATION IN METAL INTERCONNECTION APPLICATIONS

(71) Applicant: GLOBALFOUNDRIES Inc., Grand Cayman (KY)

(72) Inventors: Moosung M. Chae, Englewood Cliffs, NJ (US); Ki Young Lee, Schenectady, NY (US); Songkram Srivathanakul, Waterford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 13 days.

(21) Appl. No.: 14/933,650

(22) Filed: Nov. 5, 2015

(65) Prior Publication Data

US 2017/0133325 A1 May 11, 2017

(51) Int. Cl.
*H01L 21/768* (2006.01)
*H01L 23/532* (2006.01)
*H01L 23/522* (2006.01)

(52) U.S. Cl.
CPC .. *H01L 21/76858* (2013.01); *H01L 21/76867* (2013.01); *H01L 21/76879* (2013.01); *H01L 23/53209* (2013.01); *H01L 23/5226* (2013.01)

(58) Field of Classification Search
CPC .................................................. H01L 21/76858
USPC ........................................................ 257/751
See application file for complete search history.

(56) References Cited

U.S. PATENT DOCUMENTS

| 2014/0299988 A1* | 10/2014 | Cabral, Jr. | H01L 21/76846 257/751 |
| 2015/0147476 A1* | 5/2015 | Mizutani | H01L 21/288 427/304 |
| 2015/0262870 A1* | 9/2015 | Lin | H01L 23/5226 257/751 |
| 2015/0318243 A1* | 11/2015 | Lin | H01L 21/28518 257/751 |
| 2016/0071802 A1* | 3/2016 | Chen | H01L 21/76855 257/751 |

(Continued)

OTHER PUBLICATIONS

"Performance of Ultrathin Alternative Diffusion Barrier Metals for Next-Generation BEOL Technologies, and their Effects on Reliability", IITC 2014, T. Nogami & M. Chae et al.

(Continued)

*Primary Examiner* — Moazzam Hossain
*Assistant Examiner* — Omar Mojaddedi
(74) *Attorney, Agent, or Firm* — Heslin Rothenberg Farley & Mesiti P.C.; Stephen Scuderi

(57) ABSTRACT

A method of forming a self-forming barrier includes selectively removing a portion of a semiconductor dielectric layer to form a three-dimensional pattern within a remaining portion of the dielectric layer. A metal liner layer is disposed on a surface of the pattern to provide a metal lined pattern. A metal filling is disposed over the metal lined pattern, the metal filling being at least partially composed of a metal used in the metal liner layer. Diffusion ions are disposed in one of the metal filling and the metal liner layer. Heat is applied to the metal filling and metal liner layer to diffuse the diffusion ions from one of the metal filling and the metal liner layer into the dielectric layer to form a barrier layer between the metal liner layer and the dielectric layer.

16 Claims, 3 Drawing Sheets

(56) References Cited

U.S. PATENT DOCUMENTS

2016/0133515 A1* 5/2016 Gouk ................ H01L 21/2885
                                                            438/653

OTHER PUBLICATIONS

"Through-Cobalt Self Forming Barrier (tCoSFB), Novel Concept for Advanced Technology Nodes", IEDM 2015 (Submitted), T. Nogami & M. Chae, et al.

* cited by examiner

METHODS OF SELF-FORMING BARRIER FORMATION IN METAL INTERCONNECTION APPLICATIONS

TECHNICAL FIELD

The present invention relates to semiconductor devices and methods of fabricating the same. More specifically, the invention relates to various methods of fabricating self-forming barriers for metal interconnection applications for an integrated circuit.

BACKGROUND

A typical semiconductor manufacturing process involves selectively patterning a dielectric layer to form a three dimensional pattern of openings (such as trenches and vias) which will be filled with various metal conductors to provide the contacts, vias and interconnects between semiconductor devices.

With increasing down-scaling of integrated circuits and the increasingly demanding requirements to the speed of integrated circuits, semiconductor devices, such as transistors, need higher drive currents with increasingly smaller dimensions. However, at the smaller technology nodes of semiconductor manufacturing, such as the 10 nanometer (nm) class node, the patterned openings in a dielectric become increasingly difficult to fill. This is particularly the case when the aspect ratios of the trenches or vias become large, e.g., 10 or greater.

Accordingly, cobalt (Co) filling processes, such as electroplating, electro-less plating, atomic layer deposition (ALD), chemical vapor deposition (CVD), physical vapor deposition (PVD) and the like, have become more widely implemented in state of the art multilayer semiconductor manufacturing applications. This is due to cobalt's superior filling capabilities compared to other metals such as tungsten (W) or copper (Cu). Additionally, at the 10 nm scale, Co resistivity approaches that of W and Cu. Cobalt plating has been used in the formation of source/drain contacts, gate contacts, trench silicide contacts, conductive interconnections between semiconductor devices and the like.

However, prior art cobalt filling processes require both a protective barrier layer and a seed liner layer prior to plating. The barrier layer, which is typically tantalum nitride or titanium nitride, is required to protect the dielectric from damage caused by cobalt diffusing into the dielectric. The seed liner layer is required to provide a site for the cobalt filling to adhere or bond to.

Problematically, as semiconductors become increasingly smaller, the barrier layer and liner layer take up a significant volume within the patterned openings. Indeed, at the 10 nm size class, the barrier layer alone can occupy up to one third (⅓) of the volume of a trench or via, which can significantly reduce conductivity and performance. Moreover, since the trench and via sizes are so small, the barrier layer and the seed (or liner) layer must now be only a few nanometers thick, which makes it difficult to control the uniformity of such thin layers within the trench or via, especially when the aspect ratios approach 10. Additionally, the step of disposing a barrier layer into a patterned opening prior to filling adds cost and complexity to the semiconductor fabrication process.

Accordingly, there is a need for a process to fabricate metal barrier layers for semiconductor filling applications which occupy a small percentage of the volume of a patterned opening, such as a trench or via, in a dielectric. Moreover, there is a need for a process of forming barrier layers in such patterned openings, which do not reduce the size of the openings at all. Additionally, there is a need for a process of forming barrier layers which can eliminate the barrier deposition step all together prior to filling.

BRIEF DESCRIPTION

The present invention offers advantages and alternatives over the prior art by providing methods of forming self-forming barrier layers in semiconductor filling applications, which do not reduce the size of the patterned openings required for the filling. Additionally, the requirement of disposing a barrier layer prior to disposition of the liner layer or the filling layer is eliminated.

A method includes selectively removing a portion of a semiconductor dielectric layer to form a three-dimensional pattern within a remaining portion of the dielectric layer. A metal liner layer is disposed on a surface of the pattern to provide a metal lined pattern. A metal filling is disposed over the metal lined pattern, the metal filling being at least partially composed of a metal used in the metal liner layer. Diffusion ions are disposed in one of the metal filling and the metal liner layer. Heat is applied to the metal filling and metal liner layer to diffuse the diffusion ions from one of the metal filling and the metal liner layer into the dielectric layer to form a barrier layer between the metal liner layer and the dielectric layer.

In some embodiments the metal liner layer is a cobalt (Co) liner layer and the metal filling is a Co plating. In other embodiments the diffusion ion is a manganese (Mn) ion and the barrier layer is a Mn silicate layer.

In some aspects of the invention the method includes mixing a metal filling solution at least partially composed of the metal used in the metal liner layer, and filling the metal lined pattern with the metal filling solution to form the metal filling. In additional aspects the method can include disposing the diffusion ions into the metal filling solution prior to filling the metal lined pattern.

In alternative aspects of the invention the invention includes disposing the metal liner layer on the surface of the pattern by one of physical vapor deposition, chemical vapor deposition and atomic layer deposition. In other alternative aspects the metal liner layer is an alloy at least partially composed of the metal and the diffusion ion. In some embodiments the metal liner layer is composed of a Co/Mn alloy.

In still other embodiments the method includes heating the metal filling and the metal lining layer to over 200 degrees centigrade (C) for over 20 minutes.

DRAWINGS

The invention will be more fully understood from the following detailed description taken in conjunction with the accompanying drawings, in which.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

FIGS. 1-9 illustrate various exemplary embodiments of methods of formation of self-forming barriers in metal interconnection applications for integrated circuits in accordance with the present invention.

Figure 1:
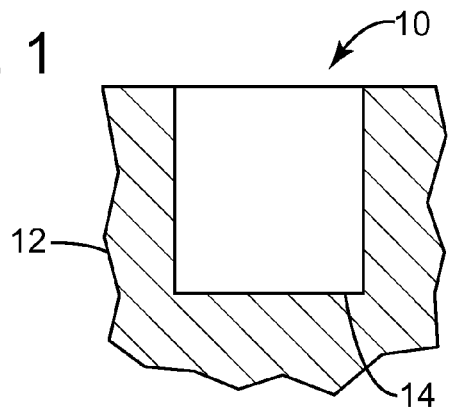
FIG. 1 is an exemplary embodiment of a cross-sectional view of a portion of a pattern disposed in a dielectric layer of an integrated circuit in an intermediate stage of manufacturing in accordance with the present invention.

Referring to FIG. 1, a simplified view of an exemplary embodiment of a state of the art semiconductor integrated circuit device 10 in accordance with the present invention is shown at an intermediate stage of manufacturing. Device 10 includes a semiconductor dielectric layer 12 wherein a portion of dielectric layer 12 has been selectively removed (or patterned) to form a three-dimensional pattern 14 within a remaining portion of the dielectric layer 12.

In this embodiment integrated circuit 10 approaches the 10 nm class size and has many layers (best seen in FIG. 9) of metallization (e.g., 4, 5 or more) stacked above a base substrate (best seen in FIG. 9) where the semiconductor devices (e.g., field effect transistors, diodes, resistors, capacitors and the like) are formed. The dielectric layer 12 is an interlayer dielectric (ILD), which is also known as an intermediate metal dielectric (IMD). The ILD 12 is used in semiconductor integrated circuit 10 to electrically separate closely spaced interconnect lines arranged in the metallization layers. As such, ILD 12 would require a low dielectric constant k (e.g., less than 3, but preferably as close to 1 as possible) to minimize capacitive coupling ("cross talk") between adjacent metal lines.

The pattern 14 includes a plurality of openings such as trenches, vias, or like structures. Pattern 14 has a pattern boundary that defines a pattern volume within the dielectric layer 12. FIG. 1 represents a simplified side view of a small portion of pattern 14. Pattern 14 is actually three-dimensional and may include many complex shapes that extend across any given layer of integrated circuit 10 and will eventually be used in an electrical interconnection system for the semiconductor integrated circuit 10.

As will be discussed in further detail herein, the trenches are filled with a metal filling to provide electrical interconnect lines between devices on a single metallization layer. The vias are filled with metal filling to provide conductive plugs between conducting layers of a multilevel metal system.

The metal filling can be disposed over the pattern (including the trenches and vias) by any number of well-known disposing processes. For example, the metal filling can be a metal plating disposed over the pattern via an electroplating process or an electro-less plating process. Additionally, the metal filling can be disposed over the pattern via an ALD, CVD or PVD process.

In an alternative embodiment, the dielectric layer 12 may be disposed directly over the base substrate of integrated circuit 10, between the semiconductor devices and the first metallization layer. As such, pattern 14 may include vias that extend through the dielectric layer 12 to the contact regions of the devices on the substrate. When the vias are filled with metal plating, they form the contacts that provide electrical communication to the substrate's various electrical devices, such as source contacts, drain contacts, gate contacts and contacts to other semiconductor devices such as resistors, capacitors, diodes and the like.

Figure 2:
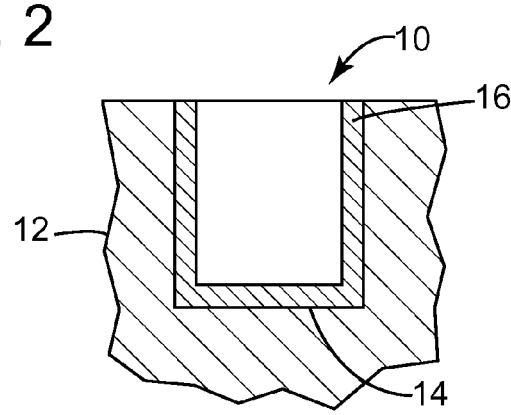
FIG. 2 is an exemplary embodiment of a cross-sectional view of a metal liner layer disposed on a surface of the pattern of FIG. 1 to provide a metal lined pattern in accordance with the present invention.

Referring to FIG. 2, prior to metal filling, a metal liner layer 16 is disposed on the surface of the pattern 14 to fill a portion of the pattern volume and to provide a metal lined pattern. Metal liner layer 16 is preferably a cobalt liner layer. The metal liner layer 16 may be disposed on the pattern 14 using various known deposition processes, such as atomic layer deposition (ALD) chemical vapor deposition (CVD), plasma enhanced CVD, physical vapor deposition (PVD) or the like. The liner layer (or seed layer) includes the same metal as the metal filling and is required to provide a site for the metal filling to adhere or bond to.

Figure 3:
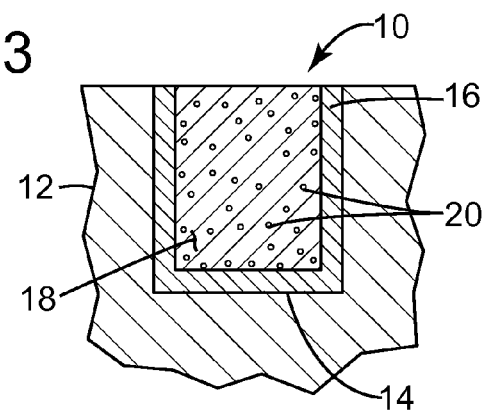
FIG. 3 is an exemplary embodiment of a metal filling having diffusion ions dispersed therein, the metal filling disposed over the metal lined pattern of FIG. 2 in accordance with the present invention.

Referring to FIG. 3, a metal filling 18 is disposed over the metal lined pattern that is composed of both the pattern 14 and its metal liner layer 16. The metal filling 18 fills the remaining portion of the pattern volume. The metal filling 18 is at least partially composed of the same metal used in the liner layer 14 and is preferably a substantially cobalt metal filling to match the preferred cobalt liner layer. The metal filling is disposed over and fills the pattern 14 through various known filling processes, such as electro plating, electro-less plating, ALD, CVD, PVD or similar.

In some exemplary embodiments, prior to filling, a metal filling solution (not shown) was prepared to be utilized during the filling process. During preparation of the filling solution, diffusion ions 20 were formed within the filling solution to ultimately be disposed in and throughout the metal filling 18 as it was filled over the metal lined pattern 16 and 14. In the preferred embodiment, the filling solution is a cobalt plating solution which was mixed with a manganese compound, such as manganese borofluoride, manganese tetrafluoride or the like, to provide manganese diffusion ions 20 in the plating solution and ultimately throughout the cobalt plating 18.

Figure 4:
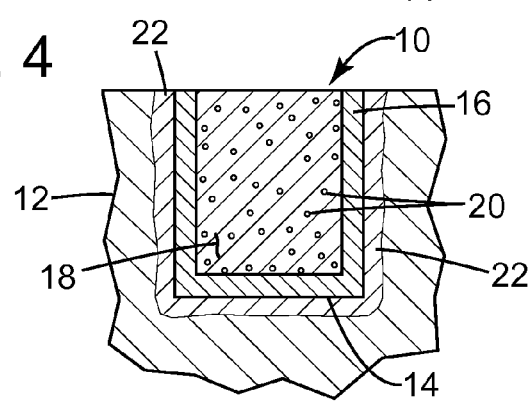
FIG. 4 is an exemplary embodiment of a self-forming barrier layer formed between the metal liner layer and dielectric of FIG. 3 in accordance with the present invention.

Referring to FIG. 4, unlike prior art metal filling processes, and particularly unlike prior art cobalt plating processes, a barrier liner deposition step has not and will not be required to protect the metal from diffusing into the adjacent dielectric material and causing performance problems. This is because during subsequent manufacturing steps, such as annealing, heat is applied to the metal filling 18 and metal liner layer 16, which induces the ions 20 to diffuse through the liner layer 16 and to cross the pattern boundary to self-form a barrier layer 22 within the dielectric 12 proximate to the boundary of the pattern 14.

Barrier layer 22 is formed by a chemical reaction with a portion of the dielectric layer 12 that is immediately proximate the pattern boundary and the diffusion ions that are diffused across the pattern boundary by the heating process. Advantageously, the barrier layer 22 does not fill any portion of the pattern volume of pattern 14.

In the preferred embodiment, the cobalt plating 18 and cobalt liner layer 16 are heated to over 200 degrees centigrade for over 20 minutes, which causes the manganese ions 20 to diffuse into the dielectric 12 react with silicon and oxygen within dielectric 12 to self-form a manganese silicates barrier layer 22. The manganese silicate layer 22 will preferably grow to between 10 to 30 angstroms in thickness, whereupon it will act as a barrier layer from further diffusion of both cobalt and manganese ions. As such, the manganese barrier layer 22 is self-limiting in that it will stop reacting and growing when the flow of manganese ions is blocked.

Advantageously, the self-forming and self-limiting barrier layer 22 does not require an extra barrier deposition step. Moreover, the barrier 22 is formed within the dielectric 12 without reducing the boundary dimensions of the pattern 14 or liner layer 16, therefore leaving more volume for the cobalt plating 18 to fill.

Figure 5:
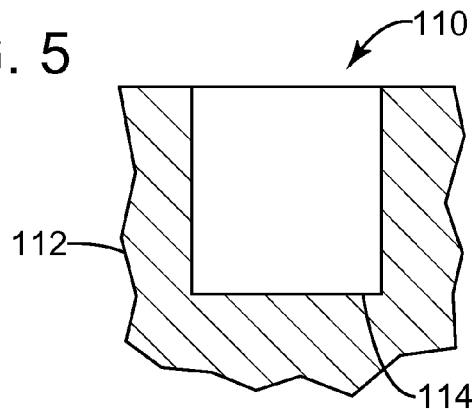
FIG. 5 is another exemplary embodiment of a cross-sectional view of a portion of a pattern disposed in a dielectric layer of an integrated circuit in an intermediate stage of manufacturing in accordance with the present invention.

Referring to FIG. 5, a simplified view of an alternative exemplary embodiment of a state of the art integrated circuit device 110 in accordance with the present invention is shown at an intermediate stage of manufacturing. Device 110 includes a semiconductor dielectric layer 112 wherein a portion of dielectric layer 112 has been selectively removed (or patterned) to form a three-dimensional pattern 114 within a remaining portion of the dielectric layer 112. The pattern 114 has a pattern boundary which defines a pattern volume. As before, the pattern 114 includes a plurality of openings, such as trenches, vias, or like structures, which will be filled with a metal filling.

Figure 6:
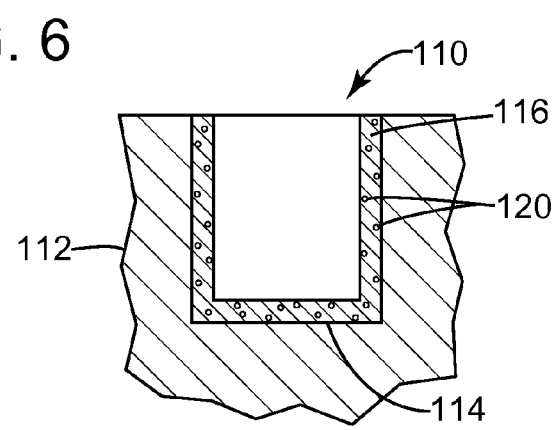
FIG. 6 is an exemplary embodiment of a cross-sectional view of a metal liner layer having diffusion ions dispersed therein, the metal liner layer disposed on a surface of the pattern of FIG. 5 to provide a metal lined pattern in accordance with the present invention.

Referring to FIG. 6, prior to metal filling, a metal liner layer 116 is disposed on the surface of the pattern 14 to fill a portion of the pattern volume and to provide a metal lined pattern. However, in this embodiment, diffusion ions 120 are disposed in and throughout the metal liner layer 116. Again, metal liner layer 116 is preferably a cobalt liner layer and the diffusion ions 120 are preferably manganese ions.

Prior to deposition of the metal liner layer 116, an alloy of the metal and diffusion ion is provided. Preferably the alloy is a cobalt manganese alloy. As before, the alloy is then disposed onto pattern 114 as the metal liner layer 116 using various known deposition processes, such as atomic layer deposition (ALD) chemical vapor deposition (CVD), plasma enhanced CVD, physical vapor deposition (PVD) or similar. The liner layer is composed of the same metal as the metal filling to provide a site for the metal filling to adhere or bond to.

Figure 7:
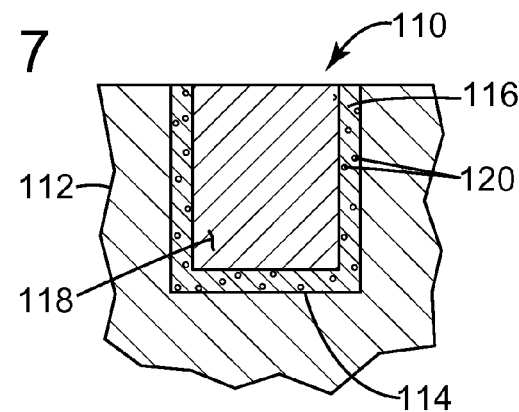
FIG. 7 is an exemplary embodiment of a metal filling disposed over the metal lined pattern of FIG. 6 in accordance with the present invention.

Referring to FIG. 7, a metal filling 118 is disposed over the metal lined pattern that is composed of both the pattern 114 and its metal liner layer 116. The metal filling 118 fills the remaining portion of the pattern volume. The metal filling 118 is at least partially composed of the same metal used in the liner layer 114 and is preferably a substantially cobalt metal plating to match the preferred cobalt liner layer. The metal filling is disposed over and fills the pattern 114 through various known filling processes, such as electro plating, electro-less plating, ALD, CVD, PVD or similar.

Figure 8:
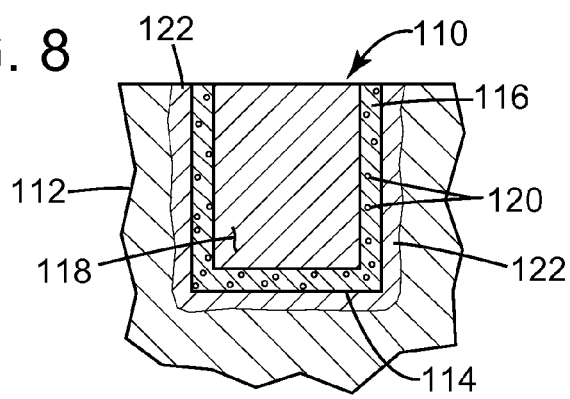
FIG. 8 is an exemplary embodiment of a self-forming barrier layer formed between the metal liner layer and dielectric of FIG. 7 in accordance with the present invention.

Referring to FIG. 8, unlike prior art metal filling processes, and particularly unlike prior art cobalt plating processes, a barrier liner deposition step has not and will not be required to protect the metal from diffusing into the adjacent dielectric material and causing performance problems. This is because during subsequent manufacturing steps, such as annealing, heat is applied to the metal filling 118 and metal liner layer 116, which induces the ions 120 to diffuse from the liner layer 116 and to cross the pattern boundary of pattern 114 to self-form a barrier layer 122 within the dielectric 112 proximate to the boundary of the pattern 114.

Barrier layer 122 is formed by a chemical reaction with a portion of the dielectric layer 112 that is immediately proximate the pattern boundary and the diffusion ions that are diffused across the pattern boundary by the heating process. Advantageously, the barrier layer 122 does not fill any portion of the pattern volume of pattern 114.

In the preferred embodiment, the metal filling 118 and metal liner layer 116 are a cobalt plating 118 and cobalt liner layer 116 respectively. As such, the cobalt plating 118 and cobalt liner layer 116 are heated to over 200 degrees centigrade for over 20 minutes, which causes the manganese ions 120 to diffuse into the dielectric 112, and react with silicon and oxygen within dielectric 112 to self-form a manganese silicates barrier layer 122. The manganese silicate layer 122 will preferably grow to between 10 to 30 angstroms in thickness, whereupon it will act as a barrier layer from further diffusion of both cobalt and manganese ions. As such, the manganese barrier layer 122 is self-limiting in that it will stop reacting and growing when the flow of manganese ions is blocked.

Advantageously, the self-forming and self-limiting barrier layer 122 does not require an extra barrier deposition step. Moreover, the barrier 122 is formed within the dielectric 112 without reducing the boundary dimensions of the pattern 114 or liner layer 116, therefore leaving more volume for the cobalt plating 118 to fill.

Figure 9:
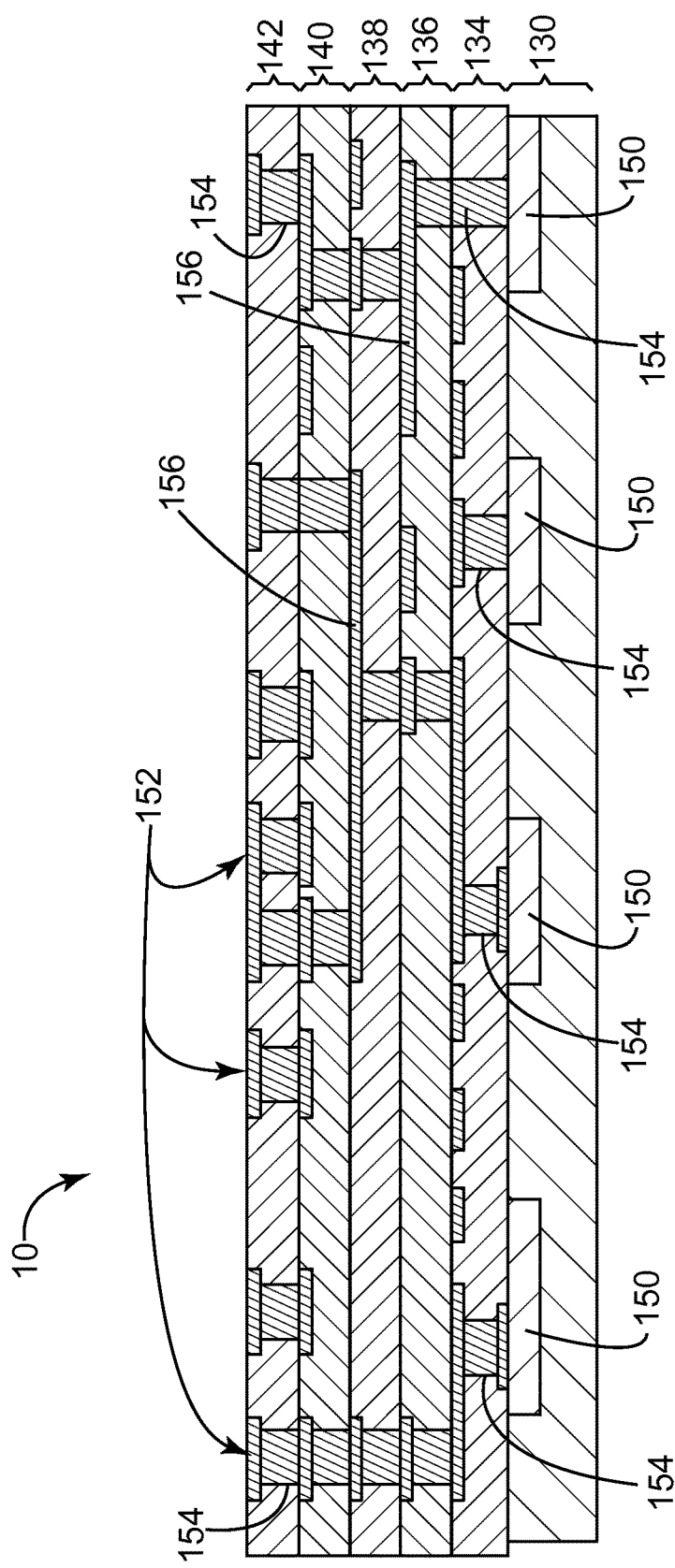
FIG. 9 is an exemplary embodiment of a cross-sectional view of an electrical interconnection system of an integrated circuit in accordance with the present invention.

Referring to FIG. 9, integrated circuit 10 includes a base substrate layer 130 and many metallization layers, including, but not limited to, metallization layers 132, 134, 136, 138, 140 and 142. The substrate layer 130 is a doped silicon layer that contains many semiconductor devices 150, such as field effect transistors, resistors, capacitors and the like, embedded therein. The self-forming barriers 22 and 122 describe herein may be used on any given layer 132-142. Once formed, self-forming barriers 22 and 122 become part of an electrical interconnection system 152 for integrated circuit 10. The first metallization layer 132 is disposed directly on the substrate 130 whereupon the interconnection system 152 contacts the semiconductor devices 150 directly though structures like vias 154 to provide the contacts for the various devices 150. Alternatively, the other metallization layers 134-142 are in electrical communication with the devices 150 through the interconnection system 152, which also includes a number of conductive structures, such as trenches 156 and vias 154 distributed throughout the integrated circuit 10. Self-forming barriers 22 and 122 may be an integral part of any one or any number of the structures that make up the electrical interconnect system 152.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A method comprising:
   selectively removing a portion of a semiconductor dielectric layer to form a three-dimensional pattern within a remaining portion of the dielectric layer, the pattern having a boundary that defines a pattern volume within the dielectric layer;
   disposing a metal liner layer on a surface of the pattern to provide a metal lined pattern;
   disposing a metal filling over the metal lined pattern, the metal filling forming at least a portion of an electrical interconnect line between devices of the semiconductor in a single metallization layer, the metal filling at least partially composed of a metal used in the metal liner layer, the metal filling entirely filing a remaining portion of the pattern volume;
   disposing diffusion ions in the metal filling such that the diffusion ions are dispersed uniformly throughout the entire volume of the metal filling; and
   applying heat to the metal filling and metal liner layer to diffuse the diffusion ions from the metal filling, through the metal liner layer and into the dielectric layer to form a self-forming barrier layer between the metal liner layer and the dielectric layer.

2. The method of claim 1 wherein the metal liner layer is a cobalt (Co) liner layer.

3. The method of claim 1 wherein the metal filling is a Co plating.

4. The method of claim 1 wherein the diffusion ion is a manganese (Mn) ion.

5. The method of claim 1 wherein the barrier layer is a Mn silicate layer.

6. The method of claim 1 wherein the thickness of the barrier layer is between 10 to 30 angstroms.

7. The method of claim 1 comprising:
   mixing a metal filling solution at least partially composed of the metal used in the metal liner layer; and
   filling the metal lined pattern with the metal filling solution to form the metal plating.

8. The method of claim 7 comprising disposing the diffusion ions into the metal filling solution prior to filling the metal lined pattern.

9. The method of claim 8 wherein the metal filling solution is a Co plating solution and the diffusion ions are Mn ions.

10. The method of claim 1 wherein the metal liner layer is an alloy at least partially composed of the metal and the diffusion ion.

11. The method of claim 10 wherein the metal liner layer is composed of a Co/Mn alloy.

12. The method of claim 1 comprising heating the metal filling and the metal lining layer to over 200 degrees centigrade (C) for over 20 minutes.

13. A method comprising:
   selectively removing a portion of an ILD layer to form a three-dimensional pattern within a remaining portion of the ILD layer, the pattern having a boundary that defines a pattern volume within the ILD layer;
   disposing a Co liner layer on a surface of the pattern to provide a Co lined pattern;
   disposing a Co plating over the Co lined pattern, the Co plating forming at least a portion of an electrical interconnect line between devices of the semiconductor in a single metallization layer, the Co plating entirely filing a remaining portion of the pattern volume;
   disposing Mn ions in the Co plating such that the Mn ions are dispersed uniformly throughout the entire volume of the Co plating; and
   applying heat to the Co plating and Co liner layer to diffuse the Mn ions from the Co plating, through the Co liner layer and into the ILD layer to form a self-forming Mn silicate barrier layer between the Co liner layer and the ILD layer.

14. The method of claim 13 comprising:
   mixing a Co plating solution containing one of Manganese Borofluoride and Manganese tetrafluoride to provide Mn ions in the plating solution; and
   filling the Co lined pattern with the Co plating solution to form the Co plating.

15. The method of claim 13 wherein the Co liner layer is a Co/Mn alloy layer disposed on the surface of the pattern by one of physical vapor deposition and chemical vapor deposition.

16. The method of claim 13 comprising annealing the Co plating and Co liner layer at a temperature of over 200 degrees C. for over 20 minutes to form the Mn silicate barrier layer.

* * * * *